(12) United States Patent
Kuwako et al.

(10) Patent No.: US 6,551,433 B2
(45) Date of Patent: Apr. 22, 2003

(54) METHOD FOR PRODUCING COPPER-CLAD LAMINATE

(75) Inventors: Fujio Kuwako, Ageo (JP); Tomohiro Ishino, Ageo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 0 days.

(21) Appl. No.: 09/904,386

(22) Filed: Jul. 12, 2001

(65) Prior Publication Data
US 2002/0005249 A1 Jan. 17, 2002

(30) Foreign Application Priority Data
Jul. 13, 2000 (JP) ........................... 2000-213223

(51) Int. Cl.[7] ................. B32B 31/00; B32B 15/08; B32B 15/20; B05D 5/12; H05K 3/00
(52) U.S. Cl. ............... 156/230; 156/233; 156/239; 156/247; 156/289; 427/96; 427/118; 427/148; 428/40.9; 428/200; 428/209; 428/344; 428/914
(58) Field of Search ............... 156/230, 233, 156/234, 239, 240, 241, 247, 289; 428/40.1, 40.7, 41.1, 42.3, 195, 200, 209, 343, 344, 914; 427/146, 147, 148, 96, 117, 118

(56) References Cited
U.S. PATENT DOCUMENTS 3,936,548 A * 2/1976 Konicek ............... 427/405
5,959,256 A * 9/1999 Saida et al. ............... 174/258

* cited by examiner

Primary Examiner—J. A. Lorengo
(74) Attorney, Agent, or Firm—Jenkens & Gilchrist

(57) ABSTRACT

An object of the invention is to prevent dent faults generated during bonding of an outer copper foil layer onto an inner layer substrate having a through hole or a cavity serving as an interlayer electrical connection means such as an interstitial via hole (IVH) or a blind via hole (BVH). In order to attain the object, there is provided a method for producing a copper-clad laminate employing the following copper foil serving as an outer layer: (1) a resin-coated copper foil being formed of copper foil having a thickness of 15 $\mu$m or more and a rupture strength of 275 kN/m$^2$ or more as measured through a bulge test performed after the foil is heated, wherein the resin-coated copper foil has a resin layer on one side of the copper foil; (2) a copper foil with etchable carrier, wherein the total thickness of the carrier layer and the copper foil layer is 20 $\mu$m or more; or (3) a copper foil with peelable carrier, wherein the total thickness of the carrier layer and the copper foil layer is 20 $\mu$m or more, the releasing layer formed between the carrier layer and the copper foil layer having a peel strength of 5 gf/cm to 300 gf/cm as measured after heating.

3 Claims, 10 Drawing Sheets

(a) Resin-coated Copper Foil with Carrier (Etchable Type)

(b) Resin-coated Copper Foil with Carrier (Peelable Type)

(a) Resin-coated Copper Foil with Carrier (Etchable Type)

(b) Resin-coated Copper Foil with Carrier (Peelable Type)

(a) Pressing (b) Peeling of Carrier Layer

METHOD FOR PRODUCING COPPER-CLAD LAMINATE

TECHNICAL FIELD TO WHICH THE INVENTION PERTAINS

The present invention relates to a method for producing a copper-clad laminate.

BACKGROUND ART

Conventionally, as means for attaining interlayer electrical connection between inner circuit layers contained in multilayer printed wiring boards, there have been employed, in an inner circuit layer substrate, means such as an interstitial via hole (IVH)—a type of through hole—or a blind via hole (BVH)—a cavity hole. These interlayer connection means, which enable formation of fine circuits of printed wiring boards, have been generally employed over a wide range as means for attaining high-density packaging, or mounting of devices.

A copper-clad laminate or a printed wiring board having such interlayer connection means as an interstitial via hole (IVH) or a blind via hole (BVH) is produced through a buildup process in which copper foil layers are sequentially bonded to an outer layer of a printed wiring board—serving as core material—in which formation of an inner circuit has been completed, to thereby form a copper-foil circuit layer comprising multilayers and a variety of via holes are buried within a substrate. FIG. 9 shows a method of pressing outer copper foil layers in a build-up process for producing a copper-clad laminate having an interstitial via hole (IVH)—a through hole—and a blind via hole (BVH)—a cavity.

As shown in FIG. 9, in general, a through hole serving as an interstitial via hole (IVH) and a cavity serving as a blind via hole (BVH) are not filled with any matter. Thus, when a typical resin-coated copper foil is pressed in a manner as shown in FIG. 9, coated resin used for bonding an outer copper foil layer flows into the holes, to thereby fill the holes.

However, such resin has a thermal expansion coefficient as large as approximately ten times that of copper foil—metallic material. Thus, during a cooling step involving curing of the resin after press-forming at high temperature, the degree of shrinkage of the resin is also greater than that of substrate. As a result, the copper foil bonded to the resin is pulled toward the inside of the holes due to shrinkage force of the resin.

In addition, in recent years, the requirement for forming fine circuits has led to a tendency of reduction in thickness of an outer copper foil layer. Accordingly, the outer copper foil layer is pulled toward the substrate, to thereby form a dent at the pulled area, and a surface of a copper-clad laminate produced from such a copper foil layer may fail to remain flat. Hereinafter, the dented state is referred to as "a dent fault" (persons in the art may call the state "a dimple fault."). FIG. 10 shows a dent fault actually occurring in an outer copper foil layer above an interstitial via hole (IVH).

When the outer copper foil layer is partially dented as shown in FIG. 10, sufficient adhesion may fail to be maintained between the dented portion of the outer copper foil layer and an etching resist layer at a stage when the etching resist layer such as dry film is formed on the outer copper foil layer, exposed, and developed, so as to form an external circuit. If such a resist adhesion failure occurs, during etching of the copper foil circuit only the portion of a copper foil circuit corresponding to the adhesion failure becomes finer, as compared with the target circuit width, and in an serious case, the portion is completely dissolved, to thereby cause an open circuit. In other words, etching precision of the portions of the outer copper foil layer immediately above the formed interstitial via hole (IVH) or blind via hole (BVH) is deteriorated, to thereby lower the production yield considerably.

SUMMARY OF THE INVENTION

In view of the foregoing, the present inventors have carried out extensive studies, and as a result, have solved the above-described problems by selecting and modifying copper foil material serving as the outer copper foil layer, in a method for producing a copper-clad laminate which method includes hot-pressing, in a build-up process, an outer copper foil layer onto an inner layer substrate having a through hole or a cavity serving as interlayer electrical connection means such as an interstitial via hole (IVH) or a blind via hole (BVH).

Accordingly, the present invention provides a first method for producing a copper-clad laminate, which method includes hot-pressing, in a build-up process, an outer copper foil layer onto an inner layer substrate having a through hole or a cavity serving as interlayer electrical connection means such as an interstitial via hole (IVH) or a blind via hole (BVH), characterized by comprising hot-pressing resin-coated copper foil onto a surface of the inner layer substrate; and optionally reducing the thickness of a copper foil layer which is to serve as an outer layer, the resin-coated copper foil being formed of copper foil having a thickness of 15 $\mu$m or more and a rupture strength of 275 $kN/m^2$ or more as measured through a bulge test performed after the foil is heated, wherein the resin-coated copper foil has a resin layer on one side of the copper foil, and hot-pressing being performed while the resin layer of the resin-coated copper foil is in contact with a surface of the inner layer substrate.

On condition that the aforementioned dents are formed by pulling of copper foil due to shrinkage of a resin during cooling after completion of hot-pressing, use of thicker copper foil is a possible means for preventing deformation due to shrinkage of the resin. In fact, use of copper foil having a thickness of 25 µm or more can prevent generation of dent faults—an object of the present invention. However, as mentioned above, since most printed wiring boards produced through a build-up process are to be used for forming fine-pitch circuits, the thickness of the copper foil for producing the wiring boards is preferably controlled to as thin as 10 µm or less. Even though copper foil having a thickness of 25 µm is used, the thickness of the copper foil must be reduced to 15 µm through physical or chemical polishing. In the present specification, the thickness of copper foil is represented by µm unit. This value is a nominal thickness which is defined in the IPC standards and is obtained from the weight thereof per unit area, and is not an actual value measured by means of a gauge.

Figure 1:
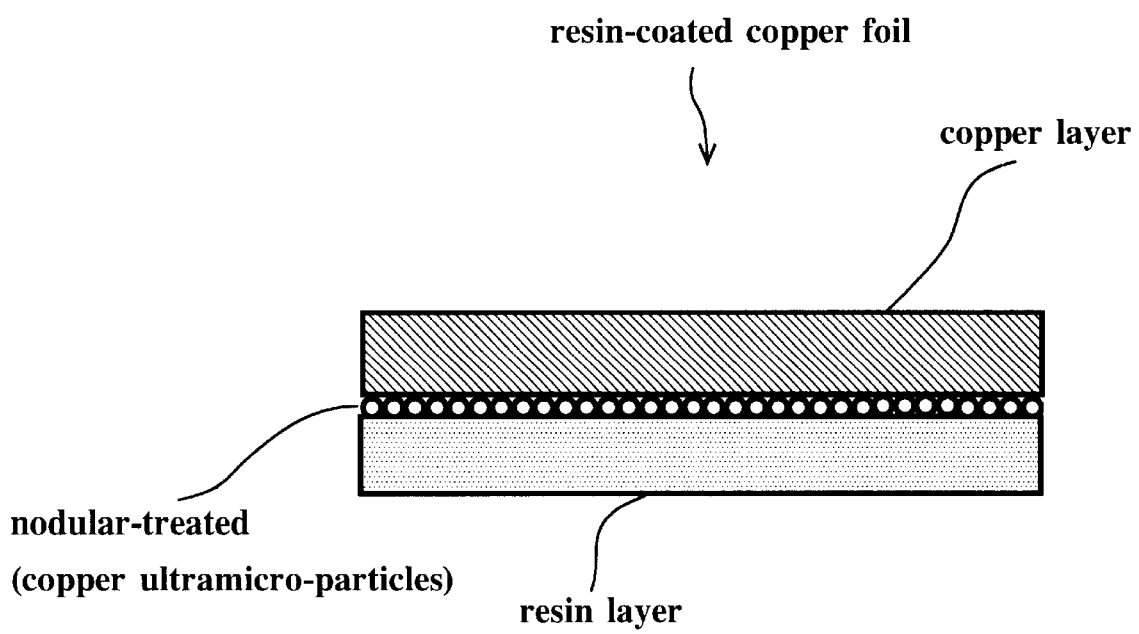
FIG. 1 is a schematic cross-sectional view of resin-coated copper foil.

The first method of the present invention is characterized by employing, as the copper foil constituting the outer copper foil layer, a resin-coated copper foil produced by forming a resin layer on one side of a copper foil having a thickness of 15 µm or more and a rupture strength of 275 kN/m$^2$ or more as measured through a bulge test performed after the foil is heated. FIG. 1 is a schematic cross-sectional view of this resin-coated copper foil. In other words, when a copper foil having a rupture strength of 275 kN/m$^2$ or more as measured through a bulge test is used, even copper foil having a thickness of 15 µm can attain the object of the present invention. The expression "rupture strength as measured through a bulge test" refers to a maximum pressure measured during a bulge test—evaluating ductility of metallic material—applied to evaluate copper foil. Specifically, in the bulge test, air is fed at a constant rate to a copper foil test sample rather than using hydraulic pressure, to thereby deform the copper foil into a hemisphere, and the maximum air pressure during deformation is measured as the rupture strength.

In the present specification, the expression "after the foil is heated" refers to "after the foil is heated in an atmosphere at 180° C. for 60 minutes." These conditions simulate the heat provided during hot pressing for producing a copper-clad laminate.

The reason for employing, as an index, the rupture strength as measured through a bulge test will be described. Namely, the phenomenon that copper foil is pulled toward the inside of holes such as an interstitial via hole (IVH) or a blind via hole (BVH) due to shrinkage of resin is considered to be similar to the deformation behavior of copper foil during a bulge test. Thus, on condition that the copper foil is of uniform thickness, the force resistant to shrinkage of resin is considered to increase with the rupture strength as measured through a bulge test. Thus, if copper foil surely has a rupture strength of 275 kN/m$^2$ or more as measured through a bulge test, the foil having a thickness of at least 15 µm is elucidated to be resistant to shrinkage of resin during cooling, to thereby prevent occurrence of the aforementioned dent faults. Accordingly, if copper foil has a rupture strength of 700 kN/m$^2$ as measured through a bulge test, the thickness of the employable copper foil can be reduced.

The copper foil having such characteristics must be copper foil containing considerably minute crystal grains and having high tensile strength, hardness, and appropriate elongation characteristics. The rupture strength of typical electrodeposited copper foil as measured in a bulge test does not satisfy the above conditions, and typical copper foil having a thickness of 18 µm has a rupture strength of as low as 207 kN/m$^2$ or less. Thus, copper foil (e.g., thickness of 15 µm) preferably to be used in the present invention exhibits a tensile strength as high as 50 kg/mm$^2$ even after the foil is heated; Vicker's hardness of approximately 150; an elongation of 3% or more in a 180° C. atmosphere; and a rupture strength of 275 kN/m$^2$ or more as measured through a bulge test after heating, uniformly imparted to the foil. Example of such copper foil include Mitsui VLP foil.

The resin layer of the aforementioned resin-coated copper foil is formed, for example, in the following manner: to a circuit-formed side of copper foil is applied a resin varnish containing ingredients; e.g., epoxy resin (60–90 wt. %) (including therein rubber-modified epoxy resin (0.5–40 wt. %)), poly(vinyl acetal) resin (5–10 wt. %), and urethane resin (0.1–20 wt. %), and the copper foil is heated to dry and cure the resin, to thereby convert the resin to a semi-cured B-stage. In other words, the resin used for forming the resin layer is not particularly limited so long as the resin imparts a sufficient bond strength to a prepreg or an inner layer substrate and serves as an insulating layer. In addition, the thickness of the resin layer can be determined arbitrarily in accordance with the specifications of the target multilayer wiring substrate.

The resin layer having the above composition is tightly bonded to resin of a prepreg during pressing to thereby form a copper-clad laminate and is cured together with the prepreg, to thereby form an insulating layer of the copper-clad laminate. If the resin layer remains and use of a prepreg is omitted, warp generated on the pressed substrate due to woven glass cloth can be eliminated, and formation of fine patterns can be further facilitated.

Use of the above described resin-coated copper foil enables use of thinner copper foil. In some cases, reduction in thickness of a copper foil layer through physical or chemical polishing can be omitted, to thereby reduce the number of production steps. Even though thickness reduction of a copper foil layer is carried out through physical or chemical polishing, the release thickness of the copper layer can be made very small, thereby attaining reduction in production costs.

Figure 2:
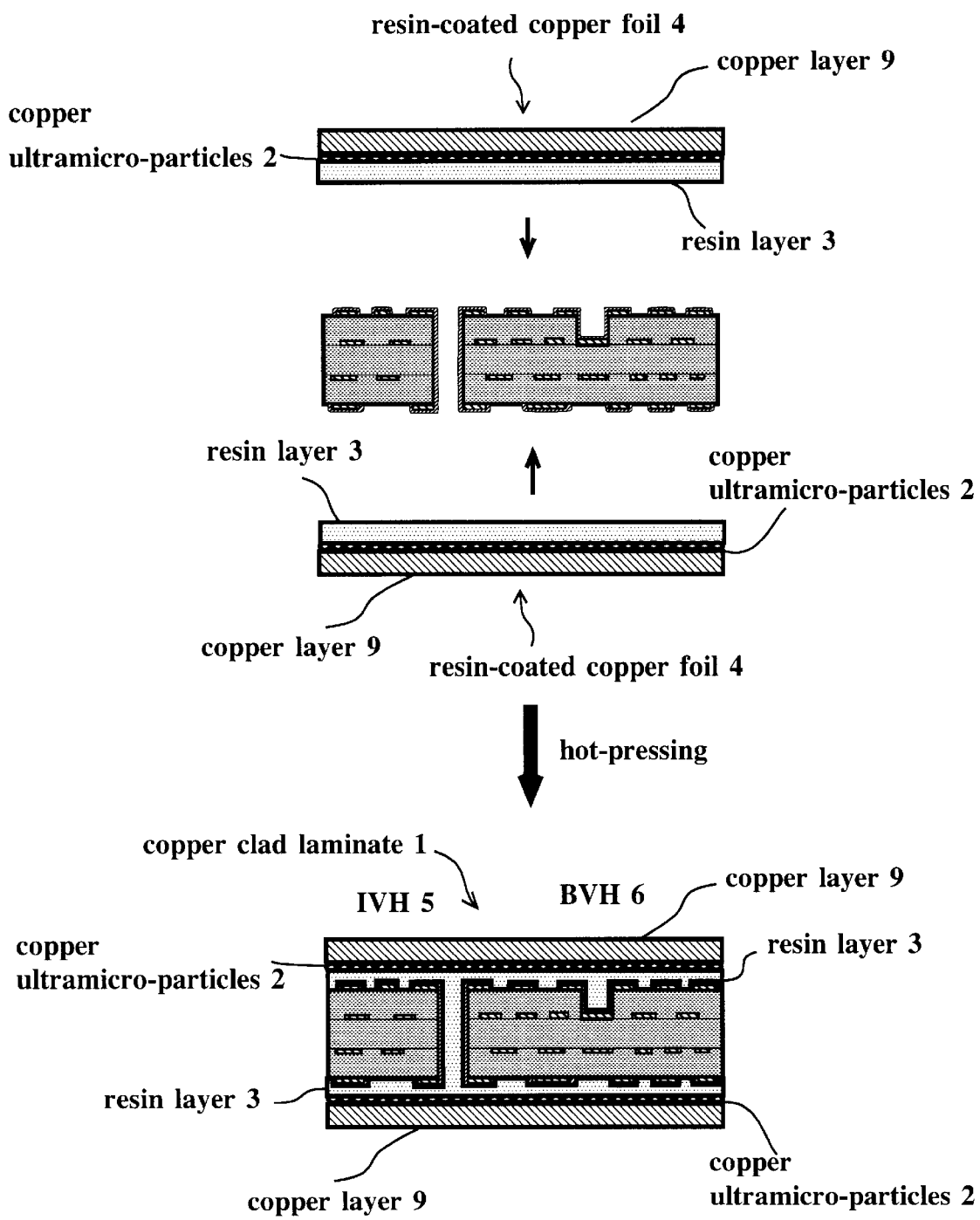
FIG. 2 is a schematic view showing a procedure of lamination of resin-coated copper foil in hot-pressing.

FIG. 2 shows a hot press process for producing a copper-clad laminate. As shown in FIG. 2, an inner layer substrate and resin-coated copper foils are laminated; the laminated product is placed in the space (daylight) between the hot-press plates of a hot-press machine while the resin layer of the resin-coated copper foil is in contact with a surface of the inner layer substrate; and hot-pressing is performed in a conventional manner. In this case, no prepreg is required to be inserted between the resin-coated copper foil and the inner layer substrate, and the resin layer of the resin-coated copper foil forms an insulating layer.

After production of a copper-clad laminate through the above procedure, if the outer copper foil layer is found to be still thick, the copper layer is subjected to thickness reduction through chemical polishing, physical polishing, or a combination thereof, to thereby produce a copper-clad laminate having no dent faults.

In a second method, the present invention provides a method for producing a copper-clad laminate, which method includes hot-pressing, in a build-up process, resin-coated copper foil with carrier and an inner layer substrate having a through hole or a cavity serving as an interlayer electrical connection means such as an interstitial via hole (IVH) or a blind via hole (BVH), characterized by comprising hot-pressing the inner layer substrate and the resin-coated copper foil with carrier; and releasing the carrier through etching, the resin-coated copper foil with carrier being formed of a carrier layer, a copper foil layer, and a resin layer formed on a surface of the copper foil layer and having an etchable carrier, wherein the carrier is released through etching, the total thickness of the carrier layer and the copper foil layer being 20 μm or more, and hot-pressing being performed while the resin layer of the of the copper foil with carrier is in contact with a surface of the inner layer substrate.

In a third method, the present invention provides a method for producing a copper-clad laminate, which method includes hot-pressing, in a build-up process, resin-coated copper foil with carrier and an inner layer substrate having a through hole or a cavity serving as an interlayer electrical connection means such as an interstitial via hole (IVH) or a blind via hole (BVH), characterized by comprising hot-pressing the inner layer substrate and the resin-coated copper foil with carrier; and releasing the carrier through peeling, the resin-coated copper foil with carrier being formed of a carrier layer, a releasing layer, a copper foil layer, and a resin layer formed on a surface of the copper foil layer and having a peelable carrier, wherein the carrier is released through peeling, the total thickness of the carrier layer and the copper foil layer being 20 μm or more, the releasing layer formed between the carrier layer and the copper foil layer having a peel strength of 5 gf/cm to 300 gf/cm as measured after heating, and hot-pressing being performed while the resin layer of the copper foil with carrier is in contact with a surface of the inner layer substrate.

The common feature of the inventions of the second and third methods of the present invention resides in use of copper foil with carrier serving as an outer copper foil layer. The copper foil with carrier—prepared by forming a copper foil layer on a surface of carrier foil for sustaining and protecting the copper foil 13 is a material used for producing a copper-clad laminate by bonding its copper foil side to a material serving as a prepreg or a substrate, followed by releasing the carrier foil. In general, the copper foil with carrier is used for producing ultra-thin copper foil having a thickness of 10 μm or less, which is difficult to handle.

Figure 3:
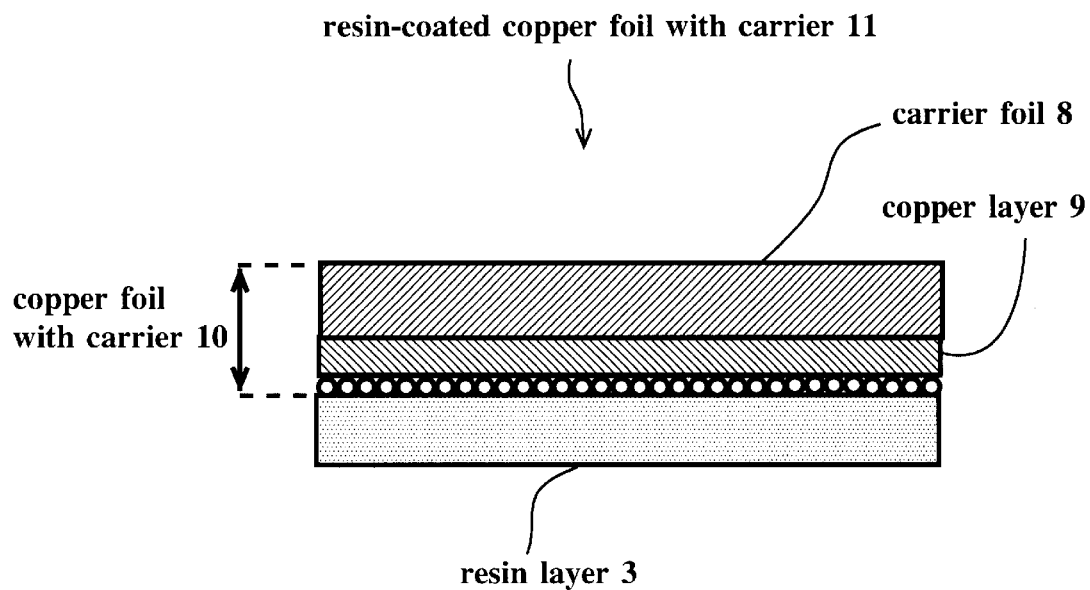
FIG. 3 shows schematic cross-sectional views of resin-coated copper foil with carrier.
Figure 3:
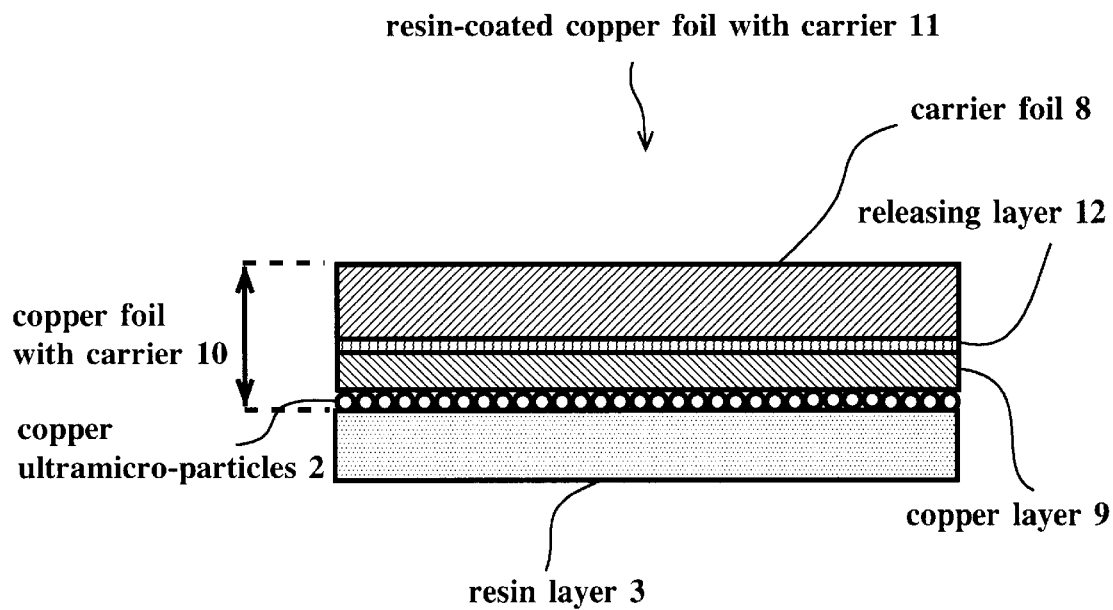

According to the method of releasing the carrier foil, copper foils with carrier are generally classified into two types; i.e., copper foil with etchable carrier in which the carrier is released by etching, and copper foil with peelable carrier in which the carrier is released by peeling. FIG. 3 shows schematic cross-sectional views of these copper foils with carrier. The second method of the present invention employs foil of etchable type, and the third method of the invention employs foil of peelable type.

The reason for using copper foil with carrier is that, because the copper foil layer is supported by the carrier foil, even when the thickness of the copper foil layer is reduced to as thin as approximately 3 μm, the thin copper foil layer can still serve as the "outer copper foil layer" in the present specification without being affected by shrinkage of a resin attributable to curing after hot-pressing, so long as the carrier foil has a thickness greater than a certain level so as to prevent occurrence of the aforementioned dent faults. The present inventors have carried out extensive studies, and have found that, when copper foil with carrier is used, a total thickness of the carrier foil layer and the copper foil layer of 20 μm is sufficient so as to prevent dent faults almost completely.

Figure 4:
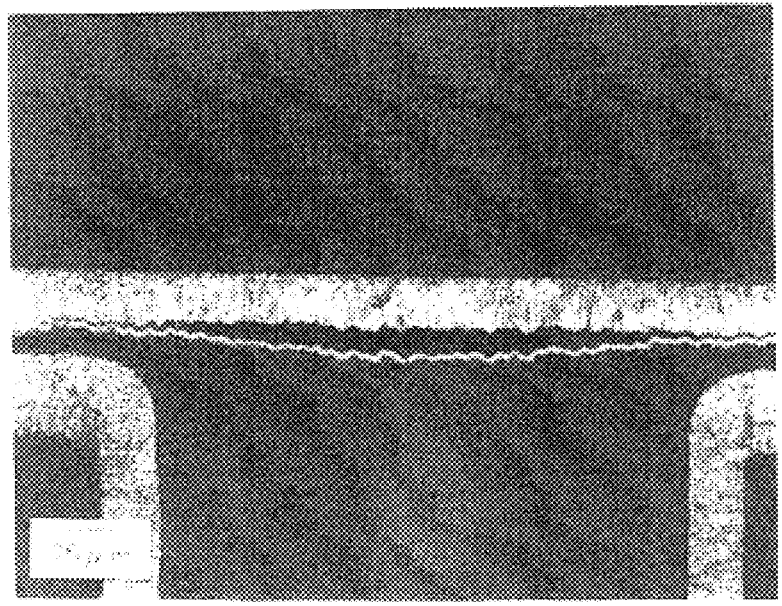
FIGS. 4 and 5 show observed conditions of an outer copper foil layer immediately above an IVH after completion of hot-pressing.

However, as described in claim 3, peelable-type copper foil with carrier has a releasing layer between the carrier foil layer and the copper foil layer as shown in FIG. 3(b), and the interface layer provides adhesiveness such that the carrier foil can be released by peeling after completion of pressing for producing a copper-clad laminate. Accordingly, when the peel strength at the releasing layer is considerably weak, the copper foil layer peels off from the carrier foil layer due to shrinkage of resin during a cooling step after completion of hot-pressing, thereby generating dent faults in the copper foil layer after release of the carrier foil. FIG. 4 shows the thus-formed dent faults.

Figure 5:

The present inventors have investigated the level of peel strength at which the carrier foil layer and the copper foil layer of copper foil with peelable carrier do not peel off from each other, and have found that a peel strength between the carrier foil layer and the copper foil layer of 5 gf/cm to 300 gf/cm, after heating, is satisfactory. Thus, when the peel strength is less than 5 gf/cm, the carrier foil layer and the copper foil layer separate from each other at the releasing layer after hot-pressing. Although no essential limitation is considered to be imposed on the upper limit of the peel strength, a peel strength of approximately 300 gf/cm is an appropriate upper limit so as to classify the copper foil with carrier as a peelable type foil in which the carrier foil is released by peeling. FIG. 5 shows the state of the outer layer of a copper-clad laminate immediately above the IVH, wherein the copper-clad laminate is produced from peelable-type copper foil with carrier having a peel strength between the carrier foil layer and the copper foil layer of 70.15 gf/cm after heating.

The releasing layer is provided by forming a metallic layer such as a zinc layer or forming an organic layer. In the former case, a desired metallic layer is formed on the carrier foil layer through plating. The latter organic layer is formed by use of an organic agent, and examples of the agent will be described hereunder. The present inventors believe that an adhesion layer formed of an organic agent provides a more uniform peel strength between the carrier foil layer and the copper foil layer.

In the present invention, at least one species selected from nitrogen-containing organic compounds, sulfur-containing organic compounds, and carboxylic acids is preferably employed as the organic agent. Among these compounds, the nitrogen-containing organic compounds may have a substituent. Specifically, substituted triazloes are preferably used. Examples include 1,2,3-benzotriazole (hereinafter referred to as BTA), carboxybenzotriazole (hereinafter referred to as CBTA), N',N'-bis(benzotriazolylmethyl) urea (hereinafter referred to as BTD-U), 1H-1,2,4-triazole (hereinafter referred to as TA), and 3-amino-1H-1,2,4-triazole (hereinafter referred to as ATA).

Examples of preferably employed sulfur-containing organic compounds include mercaptobenzothiazole (hereinafter referred to as MBT), thiocyanuric acid (hereinafter referred to as TCA), and 2-benzimidazolethiol (hereinafter referred to as BIT).

Monocarboxylic acids are particularly preferably used as the carboxylic acids. Examples include oleic acid, linoleic acid, and linolenic acid.

By use of the organic agents as described above, the releasing layer may be produced by dissolving the aforementioned organic agent in a solvent, and immersing a carrier foil in the solution or applying the solution to the surface on which a releasing layer is to be formed, through methods such as showering, spraying, dropping, and electrodeposition. The method for forming the releasing layer is not particularly limited. The releasing layer may be formed by use of an appropriate combination of the aforementioned organic agents. Alternatively, the aforementioned method for forming the releasing layer may be repeated, whereby the thickness of the releasing layer is regulated with higher precision.

When the aforementioned organic agents are used, the bond strength between the carrier foil and the copper foil can readily be controlled so as to fall within a specific range, as compared with the case in which the releasing layer is formed of a metal such as zinc. In addition, the releasing layer has excellent thermal stability and ensures a uniform peel strength after pressing. The organic film can be readily released by washing with an acidic solution such as diluted sulfuric acid or diluted hydrochloric acid, and does not affect the production steps of printed wiring boards.

From another important point of view, at present, the aforementioned organic agents have been proven to have no adverse effect on the production steps of printed wiring boards, such as a variety of resist application steps, etching steps, plating steps, and mounting steps, which are carried out after production of a copper-clad laminate.

The material for forming the resin layer of the copper foil with carrier is identical to that for forming the resin layer of the resin-coated copper foil according to claim 1. Thus, repeated description is omitted.

Figure 6:
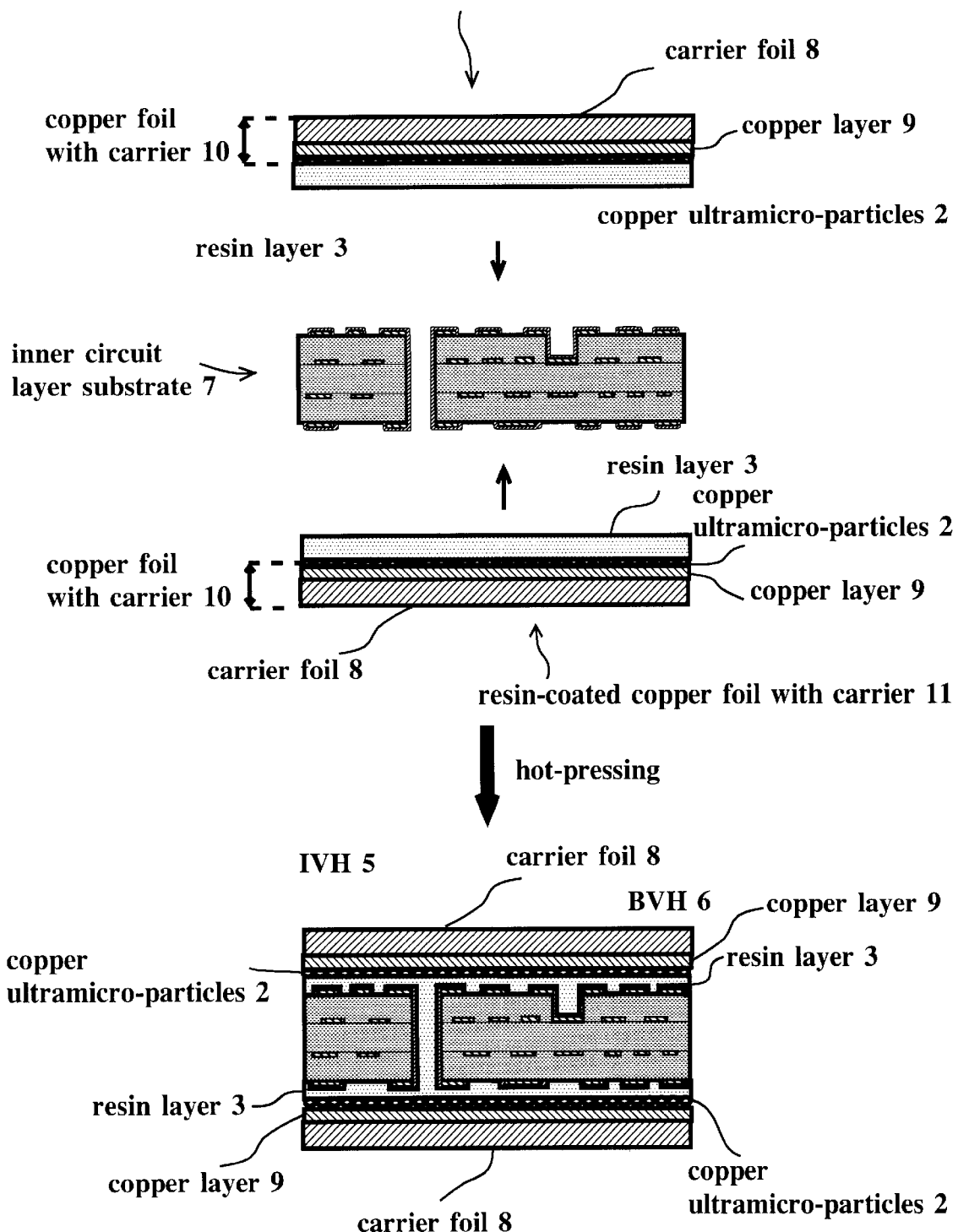
FIG. 6 is a schematic view showing a procedure of lamination of resin-coated copper foil with carrier in hot-pressing.
Figure 7:
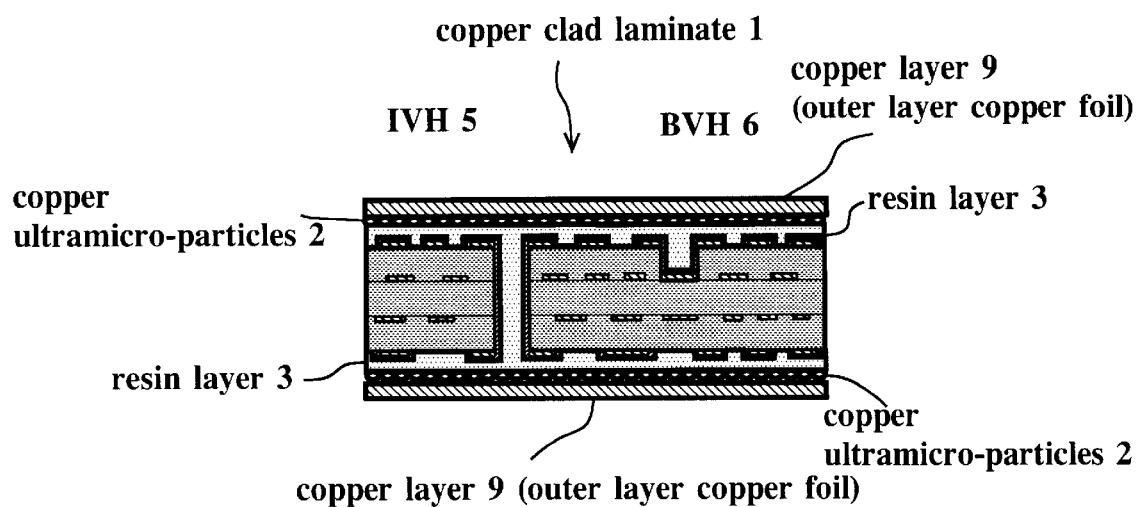
FIG. 7 is a schematic cross-sectional view of a copper-clad laminate produced from resin-coated copper foil with carrier.

The method for producing a copper-clad laminate by use of the aforementioned copper foil with carrier includes the procedures as shown in FIGS. 6 and 7. As is clear from FIG. 6, the procedure of pressing is identical to that employed in the case in which the resin-coated copper foil described in claim 1 is used. However, after completion of press-forming, a step for removing the carrier foil is added as shown in FIG. 7. In this case, when an etchable foil is used, the carrier foil is released by etching, whereas when a peelable type foil is used, the carrier foil is released by peeling. According to the above method for producing a copper-clad laminate, a copper-clad laminate in which a via hole such as an interstitial via hole (IVH) or a blind via hole (BVH) are formed can be produced without generating dent faults, even though the copper foil layer for forming a copper circuit is very thin.

Figure 8:
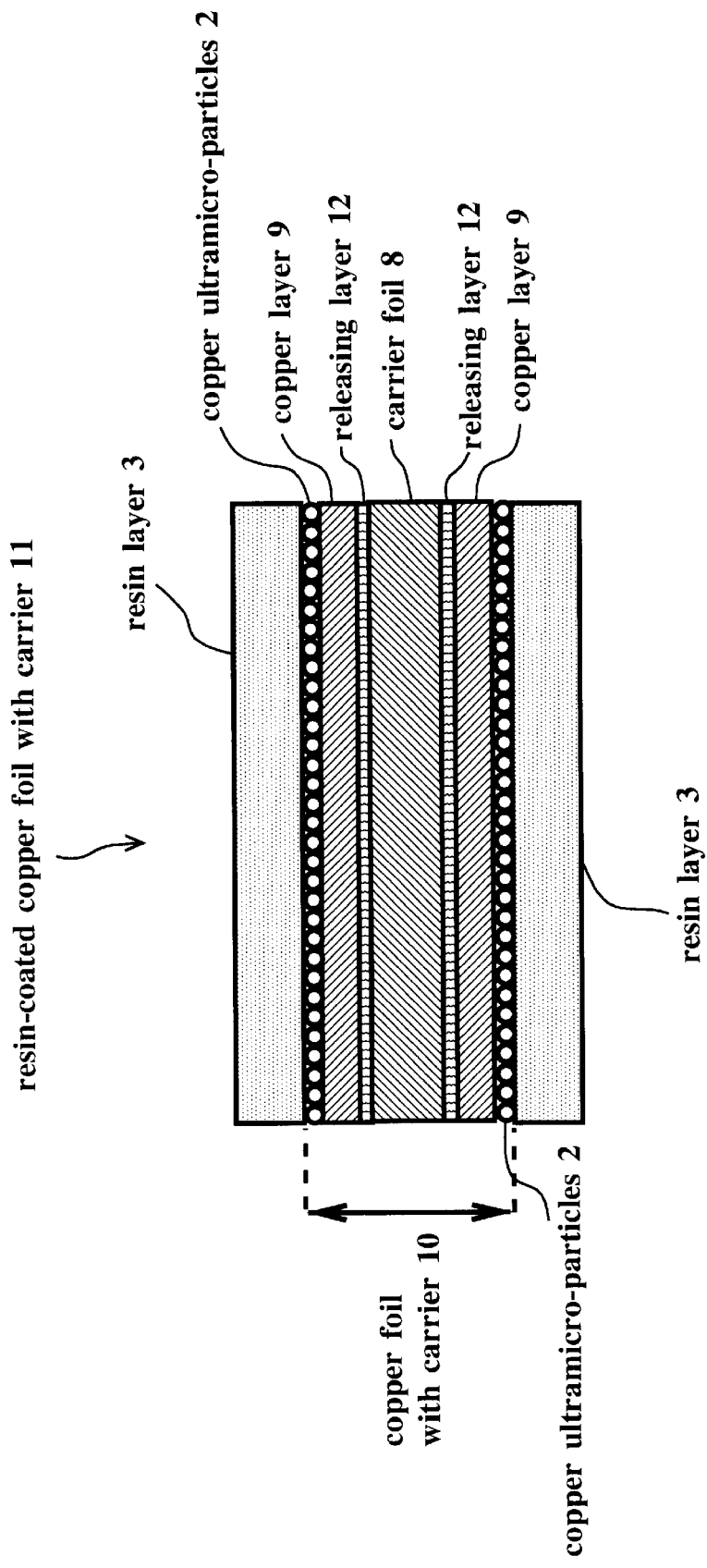
FIG. 8 is a schematic cross-sectional view of resin-coated copper foil with carrier.
Figure 9:
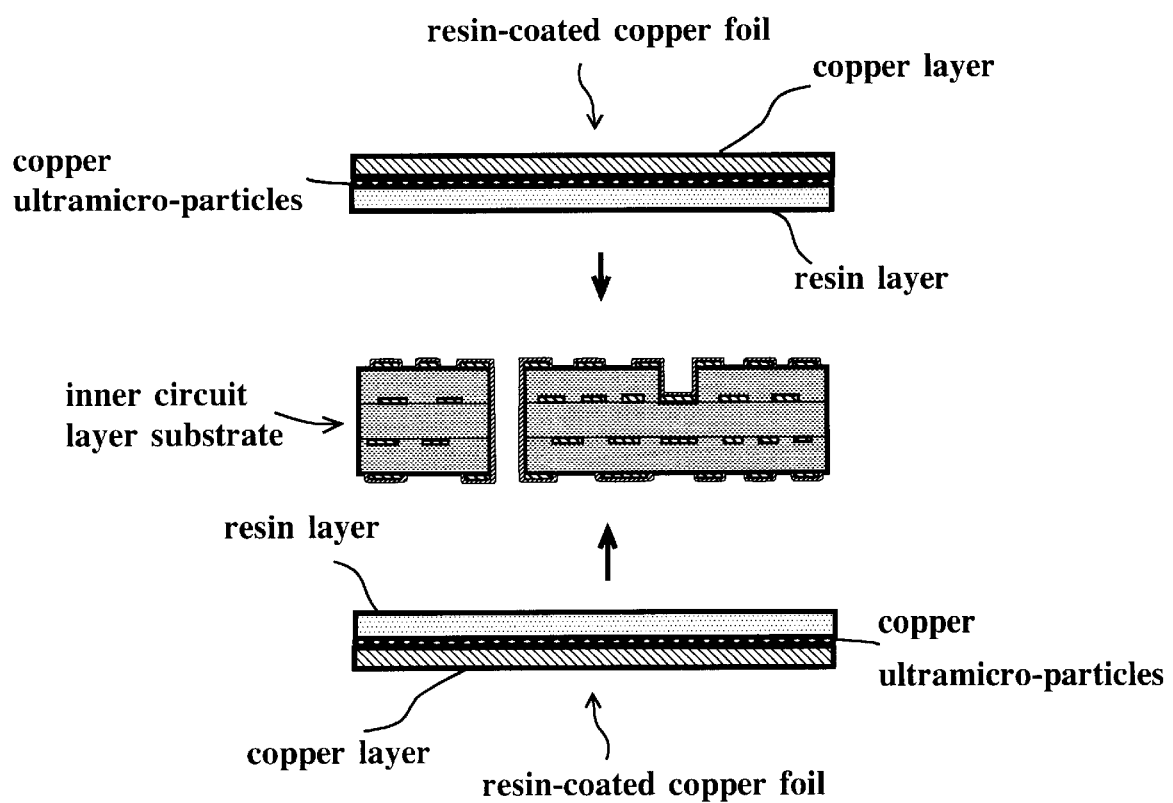
FIG. 9 is a schematic view showing a procedure of lamination of resin-coated copper foil in hot-pressing.
Figure 10:
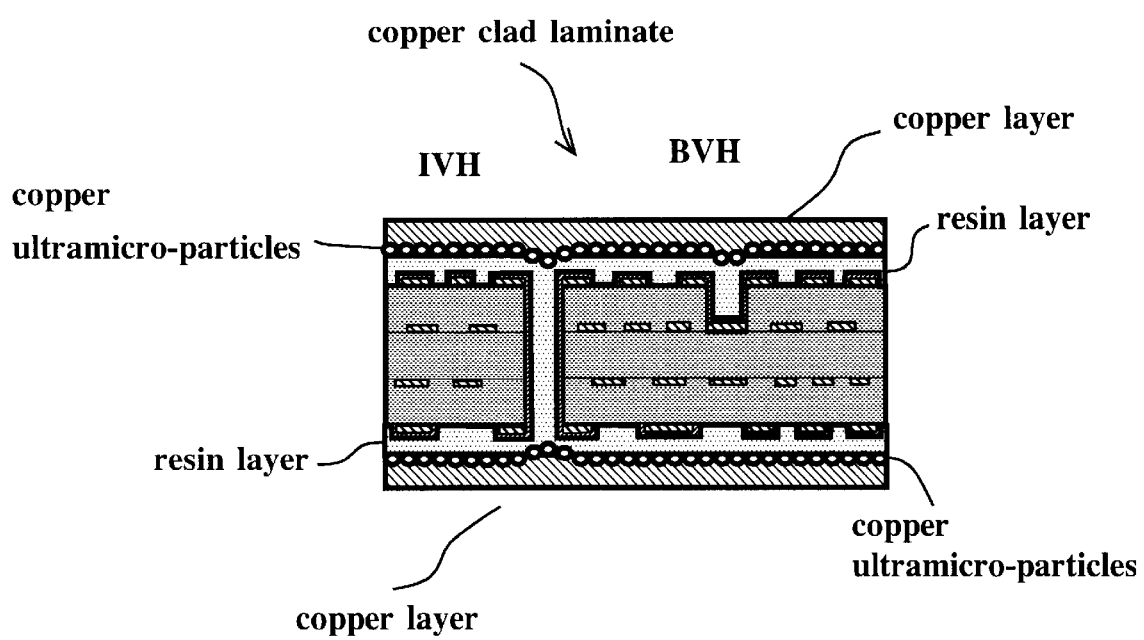
FIG. 10 is a schematic cross-sectional view of a dent fault.

As shown in FIG. 8, a copper foil layer may be formed on each side of the carrier foil of the peelable-type copper foil with carrier used herein. By the employment of such a layer structure, mirror plates to be used in a multiple lay-up process during hot-pressing can be omitted.

MODES FOR CARRYING OUT THE INVENTION

Embodiments in relation to the steps for producing a copper-clad laminate 1 by employing the aforementioned production method will next be described, with reference to the occurrence of dent faults.

EXAMPLE 1

In Example 1, a VLP copper foil having a thickness of 18 $\mu$m and classified in the IPC standards as very low profile type—a copper foil as described in claim 1—was used. The VLP copper foil exhibited a tensile strength of 52 kg/mm$^2$; Vicker's hardness of 150; an elongation of 3.8% after heating; and a rupture strength of 552 kN/m$^2$ as measured through a bulge test after heating.

The VLP copper foil was nodular-treated by depositing copper ultramicro-particles 2 on a surface of the foil, and a resin layer 3 having a thickness of 50 $\mu$m was formed on the nodular-treated surface, to thereby prepare a resin-coated copper foil 4. The resin layer 3 was formed by applying a varnish (solid content 45%) to the nodular-treated surface of the VLP copper foil, drying under air flow, and heating at 150° C. for seven minutes, to thereby form a semi-cured resin layer 3. The applied varnish was prepared by dissolving, in methyl ethyl ketone, resin ingredients including bisphenol A epoxy resin (trade name: EPOMIC R-301, product of Mitsui Petrochemical Corp.) (60 wt. %), rubber-modified (25 wt. % based on the total amount of epoxy resins) epoxy resin (trade name: EPOTOHTO YR-102, product of Tohto Kasei Co., Ltd.) (20 wt. %), poly(vinyl acetal) resin (trade name: Denka Butyral 5000A, product of Denki Kagaku Kogyo K. K.) (10 wt. %), and urethane resin (trade name: Coronate AP-Stable, product of Nippon Polyurethane Industry Co., Ltd.) (10 wt. %); a solution (solid content 25%) of dicyandiamide (reagent) in dimethylformaldehyde (2 wt. %) serving as an epoxy resin-hardening agent; and a hardening accelerator (trade name: Curezol 2E4MZ, product of Shikoku Chemicals Corp.) (0.5 wt. %).

The copper foil surface on which copper ultramicro-particles 2 had been formed was subjected to seal plating so as to prevent release of the copper ultramicro-particles 2, followed by anti-corrosion treatment. However, in the present specification, these layers are not illustrated in the figures.

The thus-produced resin-coated copper foil 4 was bonded directly to an inner circuit layer substrate 7 having a through hole or a cavity serving as an interlayer electrical connection means; i.e., an interstitial via hole (IVH) 5 or a blind via hole (BVH) 6, in a manner as schematically shown in FIG. 2, to thereby produce a copper-clad laminate 1. The occurrence of dent faults in the surface of the resin-coated copper foil 4 serving as an outer layer was observed, and no dent fault was identified.

EXAMPLE 2

In Example 2, there was used a copper foil with etchable carrier 10 which had been prepared by forming a copper layer 9 having a thickness of 3$\mu$ for forming a copper circuit on one surface of an aluminum carrier foil 8 having a thickness of 25 $\mu$m—a copper foil as described in claim 2. Hereinafter, description similar to that of Example 1 is omitted so as to avoid repetition. When possible, identical portions are denoted by the same reference numerals as used in Example 1.

The copper foil with carrier 10 was nodular-treated by depositing copper ultramicro-particles 2 on a surface of the copper foil 9, and a resin layer 3 having a thickness of 100 $\mu$m was formed on the nodular-treated surface, to thereby prepare a resin-coated copper foil with carrier 11. The varnish for producing the resin layer 3 was identical to that forming the resin layer 3 in Example 1. Thus, repeated description is omitted.

The thus-produced resin-coated copper foil with carrier 11 was bonded directly to an inner circuit layer substrate 7 having a through hole or a cavity serving as an interlayer electrical connection means; i.e., an interstitial via hole (IVH) 5 or a blind via hole (BVH) 6, in a manner schematically shown in FIGS. 6 and 7. The carrier foil 8 was released through etching by use of an alkaline etchant predominantly containing caustic soda, to thereby produce a copper-clad laminate 1 as shown in FIG. 7. The occurrence of dent faults in the surface of the coated copper foil 9 serving as an outer layer was observed, and no dent fault was identified.

EXAMPLE 3

In Example 3, there was used a copper foil with peelable carrier 10 which had been prepared by forming a copper layer 9 having a thickness of 5μ for forming a copper circuit on one surface of a copper carrier foil 8 having a thickness of 18 μm and had a releasing layer 12 formed between the carrier foil layer 8 and the copper foil layer 9 by use of carboxybenzotriazole. Hereinafter, description similar to that of Examples 1 and 2 is omitted so as to avoid repetition. When possible, identical portions are denoted by the same reference numerals as used in Examples 1 and 2.

The copper foil with carrier 10 was nodular-treated by depositing copper ultramicro-particles 2 on a surface of the copper foil 9, and a resin layer 3 having a thickness of 100 μm was formed on the nodular-treated surface, to thereby prepare a resin-coated copper foil with carrier 11. The varnish for producing the resin layer 3 was identical to that forming the resin layer 3 in Example 1. Thus, repeated description is omitted.

The thus-produced resin-coated copper foil with carrier 11 was bonded directly to an inner circuit layer substrate 7 having a through hole or a cavity serving as an interlayer electrical connection means; i.e., an interstitial via hole (IVH) 5 or a blind via hole (BVH) 6, in a manner schematically shown in FIGS. 6 and 7. The carrier foil 8 was released by manually peeling, to thereby produce a copper-clad laminate 1 as shown in FIG. 7. The peel strength between the carrier foil layer 8 and the copper foil layer 9 was found to be 75.3 gf/cm. The occurrence of dent faults in the surface of the coated copper foil 9 serving as an outer layer was observed, and no dent fault was identified.

EFFECTS OF THE INVENTION

The method for producing a copper-clad laminate according to the present invention can completely prevent dent faults generated during hot-pressing, in a build-up process, an outer copper foil layer onto an inner layer substrate having a through hole or a cavity serving as an interlayer electrical connection means such as an interstitial via hole (IVH) or a blind via hole (BVH), to thereby remarkably elevate the production yield of copper-clad laminates. Thus, production costs of copper-clad laminates in a build-up process can be reduced drastically, thereby providing such products of low-price and high-quality to the market.

What is claimed is:

1. A method for producing a copper-clad laminate, which method includes hot-pressing, in a build-up process, an outer copper foil layer onto an inner layer substrate having a through hole or a cavity serving as interlayer electrical connection means such as an interstitial via hole (IVH) or a blind via hole (BVH), the method comprising the steps of:

hot-pressing resin-coated copper foil onto a surface of the inner layer substrate; and optionally reducing the thickness of a copper foil layer which is to serve as an outer layer, the resin-coated copper foil being formed of copper foil having a thickness of 15 μm or more and a rupture strength of 275 kN/m² or more to prevent dent faults in said copper foil as measured through a bulge test performed after the foil is heated, wherein the resin-coated copper foil has a resin layer on one side of the copper foil, and hot-pressing being performed while the resin layer of the resin-coated copper foil is in contact with a surface of the inner layer substrate.

2. A method for producing a copper-clad laminate, which method includes hot-pressing, in a build-up process, resin-coated copper foil with carrier and an inner layer substrate having a through hole or a cavity serving as an interlayer electrical connection means such as an interstitial via hole (IVH) or a blind via hole (BVH), the method comprising the steps of:

hot-pressing the inner layer substrate and the resin-coated copper foil with carrier; and releasing the carrier through etching, the resin-coated copper foil with carrier being formed of a carrier layer, a copper foil layer, and a resin layer formed on a surface of the copper foil layer and having an etchable carrier, wherein the carrier is released through etching, the total thickness of the carrier layer and the copper foil layer being 20 μm or more to prevent dent faults in said copper foil, and hot-pressing being performed while the resin layer of the copper foil with carrier is in contact with a surface of the inner layer substrate.

3. A method for producing a copper-clad laminate, which method includes hot-pressing, in a build-up process, resin-coated copper foil with carrier and an inner layer substrate having a through hole or a cavity serving as an interlayer electrical connection means such as an interstitial via hole (IVH) or a blind via hole (BVH), the method comprising the steps of:

hot-pressing the inner layer substrate and the resin-coated copper foil with carrier; and releasing the carrier through peeling, the resin-coated copper foil with carrier being formed of a carrier layer, a releasing layer, a copper foil layer, and a resin layer formed on a surface of the copper foil layer and having a peelable carrier, wherein the carrier is released through peeling, the total thickness of the carrier layer and the copper foil layer being 20 μm or more to prevent dent faults in said copper foil, the releasing layer formed between the carrier layer and the copper foil layer having a peel strength of 5 gf/cm to 300 gf/cm as measured after heating, and hot-pressing being performed while the resin layer of the copper foil with carrier is in contact with a surface of the inner layer substrate.

* * * * *